(12) United States Patent
Basker et al.

(10) Patent No.: US 10,734,518 B2
(45) Date of Patent: Aug. 4, 2020

(54) SUBSTANTIALLY DEFECT FREE RELAXED HETEROGENEOUS SEMICONDUCTOR FINS ON BULK SUBSTRATES

(71) Applicant: International Business Machines Corporation, Armonk, NY (US)

(72) Inventors: Veeraraghavan S. Basker, Schenectady, NY (US); Oleg Gluschenkov, Tannersville, NY (US); Shogo Mochizuki, Clifton Park, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/230,427

(22) Filed: Dec. 21, 2018

(65) Prior Publication Data
US 2019/0148549 A1 May 16, 2019

Related U.S. Application Data

(62) Division of application No. 15/157,996, filed on May 18, 2016, now Pat. No. 10,170,620.

(51) Int. Cl.
| | |
|---|---|
| *H01L 21/02* | (2006.01) |
| *H01L 29/78* | (2006.01) |
| *H01L 29/04* | (2006.01) |
| *H01L 29/66* | (2006.01) |

(52) U.S. Cl.
CPC ........ *H01L 29/7842* (2013.01); *H01L 29/045* (2013.01); *H01L 29/66795* (2013.01); *H01L 29/785* (2013.01); *H01L 29/7851* (2013.01)

(58) Field of Classification Search
CPC combination set(s) only.
See application file for complete search history.

(56) References Cited

U.S. PATENT DOCUMENTS

| | | |
|---|---|---|
| 7,910,413 B2 | 3/2011 | Zhu |
| 8,017,463 B2 | 9/2011 | Chang |
| 8,703,565 B2 | 4/2014 | Chang et al. |
| 8,951,870 B2 | 2/2015 | Basker et al. |
| 9,941,302 B2 | 4/2018 | Basker et al. |
| 2007/0110577 A1 | 5/2007 | Danielson |

(Continued)

OTHER PUBLICATIONS

List of IBM Patents or Patent Applications Treated as Related Dated Dec. 21, 2018, 2 Pages.

(Continued)

*Primary Examiner* — Allen L Parker
*Assistant Examiner* — Waisul Haider
(74) *Attorney, Agent, or Firm* — Scully, Scott, Murhpy & Presser, P.C.; Daniel P. Morris, Esq.

(57) ABSTRACT

A semiconductor structure is provided that includes a bulk semiconductor substrate of a first semiconductor material. The structure further includes a plurality of fin pedestal structures of a second semiconductor material located on the bulk semiconductor substrate of the first semiconductor material, wherein the second semiconductor material is different from the first semiconductor material. In accordance with the present application, each fin pedestal structure includes a pair of spaced apart semiconductor fins of the second semiconductor material.

15 Claims, 5 Drawing Sheets

(56) References Cited

U.S. PATENT DOCUMENTS

| | | |
|---|---|---|
| 2013/0280883 A1 | 10/2013 | Faul et al. |
| 2014/0151814 A1 | 6/2014 | Giles et al. |
| 2014/0374807 A1 | 12/2014 | Jacob et al. |
| 2015/0050800 A1* | 2/2015 | Brand ............... H01L 21/0262 438/478 |
| 2015/0179503 A1* | 6/2015 | Tsai ............... H01L 21/76224 257/347 |
| 2015/0179766 A1 | 6/2015 | Zang et al. |
| 2015/0228648 A1* | 8/2015 | Chi ............... H01L 21/30625 257/401 |
| 2015/0255457 A1 | 9/2015 | Loubet et al. |
| 2015/0287614 A1 | 10/2015 | Cheng et al. |
| 2015/0311320 A1 | 10/2015 | Cheng et al. |
| 2015/0318169 A1 | 11/2015 | Qi et al. |
| 2016/0181095 A1* | 6/2016 | Cheng ............... H01L 21/02532 257/616 |
| 2016/0190483 A1* | 6/2016 | Kim ............... H01L 51/0085 257/40 |
| 2016/0343623 A1* | 11/2016 | Fogel ............... H01L 21/82387 |
| 2017/0005169 A1 | 1/2017 | Loubet et al. |
| 2018/0190483 A1 | 7/2018 | Reznicek et al. |

OTHER PUBLICATIONS

Office Action dated Jan. 3, 2020 received in U.S. Appl. No. 16/230,340.

\* cited by examiner

US 10,734,518 B2

1

SUBSTANTIALLY DEFECT FREE RELAXED HETEROGENEOUS SEMICONDUCTOR FINS ON BULK SUBSTRATES

BACKGROUND

The present application relates to a semiconductor structure and a method of forming the same. More particularly, the present application relates to a semiconductor structure including a plurality of substantially defect free relaxed semiconductor fins of a second semiconductor material located above a surface of a bulk semiconductor substrate of a first semiconductor material that differs from the second semiconductor material and a method of forming the same.

The use of non-planar semiconductor devices such as, for example, silicon fin field effect transistors (FinFETs) is the next step in the evolution of complementary metal oxide semiconductor (CMOS) devices. Silicon fin field effect transistors (FETs) can achieve higher drive currents with increasingly smaller dimensions as compared to conventional planar FETs. In order to extend these devices for multiple technology nodes such as, for example, 10 nm and beyond, there is a need to boost the performance with high-mobility channels.

In such FinFET devices, fins containing a silicon germanium alloy or a III-V compound semiconductor are examples of promising channel materials because of their high-carrier mobility which enhances device performance at smaller device sizes. Formation of such high channel mobility fins is challenging due to the lattice mismatch of those semiconductor materials with silicon. Typically, silicon germanium alloy fins (or III-V compound semiconductor fins) are formed by epitaxially growing a layer of silicon germanium alloy or a III-V compound semiconductor on a bulk silicon substrate. The layer of silicon germanium alloy or III-V compound semiconductor is then patterned utilizing extreme ultraviolet (EUV) lithography. The use of EUV lithography is an expensive method to form high channel mobility fins having tight fin pitches.

SUMMARY

In one aspect of the present application, a semiconductor structure is provided. In one embodiment of the present application, the semiconductor structure includes a bulk semiconductor substrate of a first semiconductor material. The semiconductor structure further includes a plurality of fin pedestal structures of a second semiconductor material located on the bulk semiconductor substrate of the first semiconductor material, wherein the second semiconductor material is different from the first semiconductor material. In accordance with the present application, each fin pedestal structure includes a pair of spaced apart semiconductor fins of the second semiconductor material.

In another aspect of the present application, a method of forming a semiconductor structure is provided. In one embodiment of the present application, the method includes providing a plurality of first semiconductor fins on a bulk semiconductor substrate, wherein each first semiconductor fin and the bulk semiconductor substrate comprise a first semiconductor material. Next, a conformal layer of a second semiconductor material that differs from the first semiconductor material is formed on exposed surfaces of the first semiconductor fins and the bulk semiconductor substrate. A first dielectric material is then formed on the conformal layer and, thereafter, an upper portion of the first dielectric material and a portion of the conformal layer that is present on the topmost surface of each first semiconductor fin are removed to provide a first dielectric material portion and a plurality of second semiconductor fins of the second semiconductor material. Next, each first semiconductor fin is removed and thereafter, a second dielectric material portion is formed, wherein the second dielectric material portion has a topmost surface that is coplanar with a topmost surface of the first dielectric material portion and each second semiconductor fin. Next, the first and second dielectric material portions are recessed to expose an upper portion of each second semiconductor fin.

DETAILED DESCRIPTION

Figure 1:
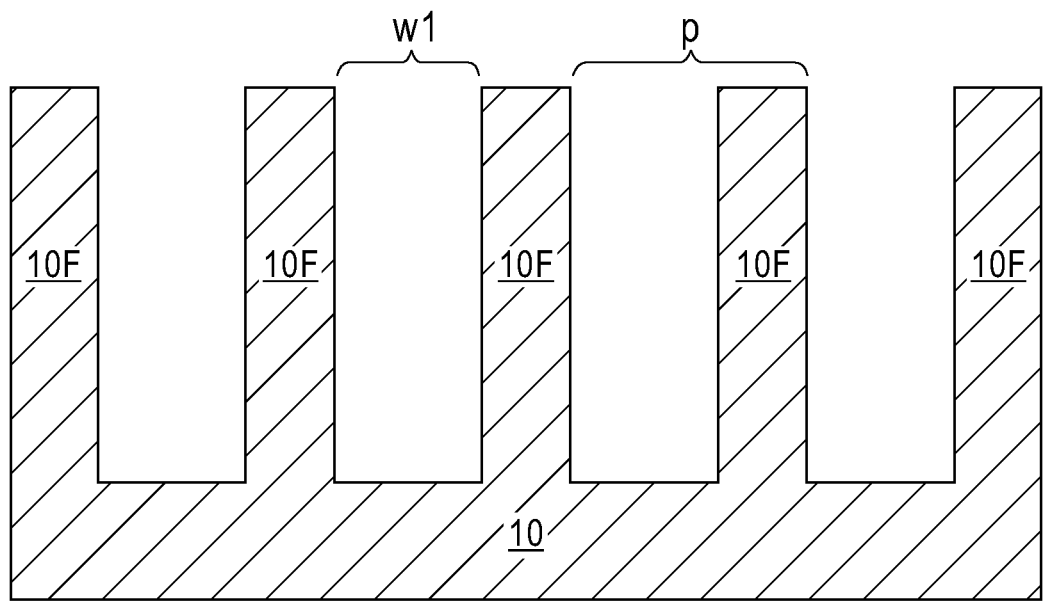
FIG. 1 is a cross sectional view of an exemplary semiconductor structure including a plurality of first semiconductor fins extending upwards from a bulk semiconductor substrate, wherein each first semiconductor fin and the bulk semiconductor substrate comprise a first semiconductor material.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring first to FIG. 1, there is illustrated an exemplary semiconductor structure including a plurality of first semiconductor fins 10F extending upwards from a bulk semiconductor substrate 10, wherein each first semiconductor fin 10F and the bulk semiconductor substrate 10 comprise a first semiconductor material.

The term "bulk semiconductor substrate" denotes a substrate that is entirely composed of a first semiconductor material having semiconducting properties; no insulator material and/or conductive material is present in a bulk semiconductor substrate. The first semiconductor material that provides the bulk semiconductor substrate 10 and each first semiconductor fin 10F may include silicon (Si), germanium (Ge), silicon germanium (SiGe) alloys, III-V compound semiconductors, or II-VI compound semiconductors. III-V compound semiconductors are materials that include at least one element from Group III of the Periodic Table of Elements and at least one element from Group V of the Periodic Table of Elements. II-VI compound semiconductors are materials that include at least one element from Group II of the Periodic Table of Elements and at least one element from Group VI of the Periodic Table of Elements. In one embodiment, the bulk semiconductor substrate 10 and each first semiconductor fin 10F are composed entirely of silicon.

The first semiconductor material that provides the bulk semiconductor substrate 10 may have any of the well known crystal orientations. For example, the crystal orientation of the bulk semiconductor substrate 10 may be {100}, {110}, or {111}. Other crystallographic orientations besides those specifically mentioned can also be used in the present application. At least an upper portion of the bulk semiconductor substrate is single crystalline.

The exemplary semiconductor structure of FIG. 1 can be formed by first providing a bulk semiconductor substrate and thereafter the plurality of first semiconductor fins 10F can be formed by patterning an upper portion of the bulk semiconductor substrate. In FIG. 1, five first semiconductor fins 10F are shown by way of one example. The number of first semiconductor fins 10F that are formed at this point of the present application may vary so long as at least one first semiconductor fin 10F is formed.

In one embodiment, the patterning process used to define the plurality of first semiconductor fin 10F may include lithography and etching. Lithography includes forming a photoresist material (not shown) atop a material or material stack to be patterned. The photoresist material may include a positive-tone photoresist composition, a negative-tone photoresist composition or a hybrid-tone photoresist composition. The photoresist material may be formed by a deposition process such as, for example, spin-on coating. After forming the photoresist material, the deposited photoresist material is subjected to a pattern of irradiation. Next, the exposed photoresist material is developed utilizing a conventional resist developer. This provides a patterned photoresist atop a portion of the material or material stack to be patterned. The pattern provided by the patterned photoresist material is thereafter transferred into the underlying material layer or material layers utilizing at least one pattern transfer etching process. Typically, the at least one pattern transfer etching process is an anisotropic etch. In one embodiment, a dry etching process such as, for example, reactive ion etching can be used. In another embodiment, a chemical etchant can be used. In still a further embodiment, a combination of dry etching and wet etching can be used. In the present application, the etch stops within a portion of the bulk semiconductor substrate 10.

In another embodiment, the patterning process may include a sidewall image transfer (SIT) process. The SIT process includes forming a mandrel material layer (not shown) atop the material or material layers that are to be patterned. The mandrel material layer (not shown) can include any material (semiconductor, dielectric or conductive) that can be selectively removed from the structure during a subsequently performed etching process. In one embodiment, the mandrel material layer (not shown) may be composed of amorphous silicon or polysilicon. In another embodiment, the mandrel material layer (not shown) may be composed of a metal such as, for example, Al, W, or Cu. The mandrel material layer (not shown) can be formed, for example, by chemical vapor deposition or plasma enhanced chemical vapor deposition. Following deposition of the mandrel material layer (not shown), the mandrel material layer (not shown) can be patterned by lithography and etching to form a plurality of mandrel structures (also not shown) on the topmost surface of the structure.

The SIT process continues by forming a spacer on each sidewall of each mandrel structure. The spacer which can be composed of any material that has a different etch selectivity than the mandrel material can be formed by deposition of a spacer material and then etching the deposited spacer material. In one example, the spacer material may be composed of any dielectric spacer material such as, for example, silicon dioxide, silicon nitride or a dielectric metal oxide. Examples of deposition processes that can be used in providing the spacer material include, for example, chemical vapor deposition (CVD), plasma enhanced chemical vapor deposition (PECVD), or atomic layer deposition (ALD). Examples of etching that be used in providing the spacers include any etching process such as, for example, reactive ion etching. After formation of the spacers, the SIT process continues by removing each mandrel structure. Each mandrel structure can be removed by an etching process that is selective for removing the mandrel material. Following the mandrel structure removal, the SIT process continues by transferring the pattern provided by the spacers into the underlying material or material layers. The pattern transfer may be achieved by utilizing at least one etching process. Examples of etching processes that can used to transfer the pattern may include dry etching (i.e., reactive ion etching, plasma etching, and ion beam etching or laser ablation) and/or a chemical wet etch process. In one example, the etch process used to transfer the pattern may include one or more reactive ion etching steps. Upon completion of the pattern transfer, the SIT process concludes by removing the spacers from the structure. Each spacer may be removed by etching or a planarization process.

In yet another embodiment, the patterning process may include a direct self-assembly (DSA) patterning process.

As used herein, a "fin" refers to a contiguous semiconductor material, and including a pair of vertical sidewalls that are parallel to each other. As used herein, a surface is "vertical" if there exists a vertical plane from which the surface does not deviate by more than three times the root mean square roughness of the surface. In one embodiment of the present application, each first semiconductor fin 10F may have a width from 4 nm to 30 nm; the height of each first semiconductor fin 10F may be from 10 nm to 150 nm. Other widths and heights that are lesser than, or greater than the ranges mentioned herein can also be used in the present application. Each first semiconductor fin 10F can be separated by a gap having a width, w1, of from 20 nm to 50 nm. In the present application, the pitch, p, as measured from one sidewall surface of one of the first semiconductor fins to the equivalent sidewall surface of a nearest neighboring first semiconductor fin is from 40 nm to 120 nm.

Figure 2:
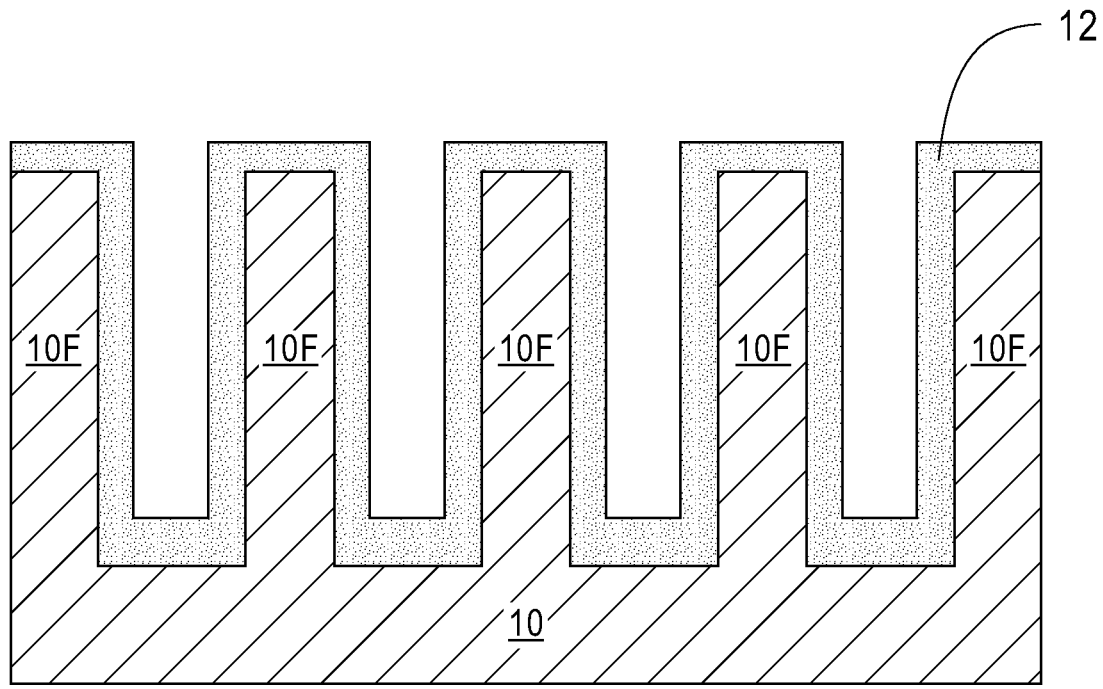
FIG. 2 is a cross sectional view of the exemplary semiconductor structure of FIG. 1 after forming a conformal layer of a second semiconductor material that differs from the first semiconductor material that constitutes each first semiconductor fin and the bulk semiconductor substrate.

Referring now to FIG. 2, there is illustrated the exemplary semiconductor structure of FIG. 1 after forming a conformal layer 12 of a second semiconductor material that differs from the first semiconductor material that constitutes each first semiconductor fin 10F and the bulk semiconductor substrate 10. A portion of the conformal layer 12 partially fills that gap that is located between each first semiconductor fin 10F. Since the conformal layer 12 comprises a second semiconductor material that differs from the first semiconductor material that provides the first semiconductor fins 10F, the conformal layer (and resultant second semiconductor fins that are subsequently formed therefrom) can be referred to as a heterogeneous semiconductor material.

The second semiconductor material that provides the conformal layer 12 comprises one of the semiconductor materials mentioned above for the bulk semiconductor substrate 10 and first semiconductor fins 10F so long as the second semiconductor material differs from the first semiconductor material that provides the bulk semiconductor substrate 10 and the first semiconductor fins 10F. Also, the second semiconductor material that provides the conformal layer 12 has a greater (i.e., higher) carrier (i.e., electron or hole) mobility than the first semiconductor material of the semiconductor fins 10F. That is, the second semiconductor material that provides the conformal layer 12 is composed of a second semiconductor material in which electrons or holes move through the second semiconductor material more quickly than the first semiconductor material that provides the semiconductor fins 10F. For example, when the first semiconductor fins 10F are composed of silicon, the conformal layer 12 is composed of a silicon germanium alloy or a III-V compound semiconductor.

The conformal layer 12 may be formed utilizing a conformal epitaxial growth process. The terms "epitaxially growing and/or depositing" and "epitaxially grown and/or deposited" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. Since an epitaxial growth process is used in providing the conformal layer 12, the conformal layer 12 has an epitaxial relationship with the exposed surfaces of the first semiconductor fins 10F and the underlying bulk semiconductor substrate 10.

The term "conformal" denotes that the vertical thickness of the material layer atop horizontal surfaces is substantially the same (100% or less than a factor of two) as the lateral thickness (i.e., width) of the same material layer along sidewall surfaces. In the present application, the conformal layer 12 may have a thickness from 5 nm to 20 nm. Other thicknesses that are lesser than or greater than the aforementioned thickness range are also possible in the present application.

Examples of various epitaxial growth process apparatuses that can be employed in the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition typically ranges from 550° C. to 900° C. Although higher temperature typically results in faster deposition, the faster deposition may result in crystal defects and film cracking. The epitaxial growth of the conformal layer 12 can be performed utilizing any well known precursor gas or gas mixture. Carrier gases like hydrogen, nitrogen, helium and argon can be used.

The conformal layer 12 (and the corresponding second semiconductor fins to be subsequently formed from the conformal layer) is substantially defect free. By "substantially defect free" it is meant a defect density of less than 100 defects per square centimeter. Also, the conformal layer 12 (and the corresponding second semiconductor fins to be subsequently formed from the conformal layer) is a relaxed layer.

Figure 3:
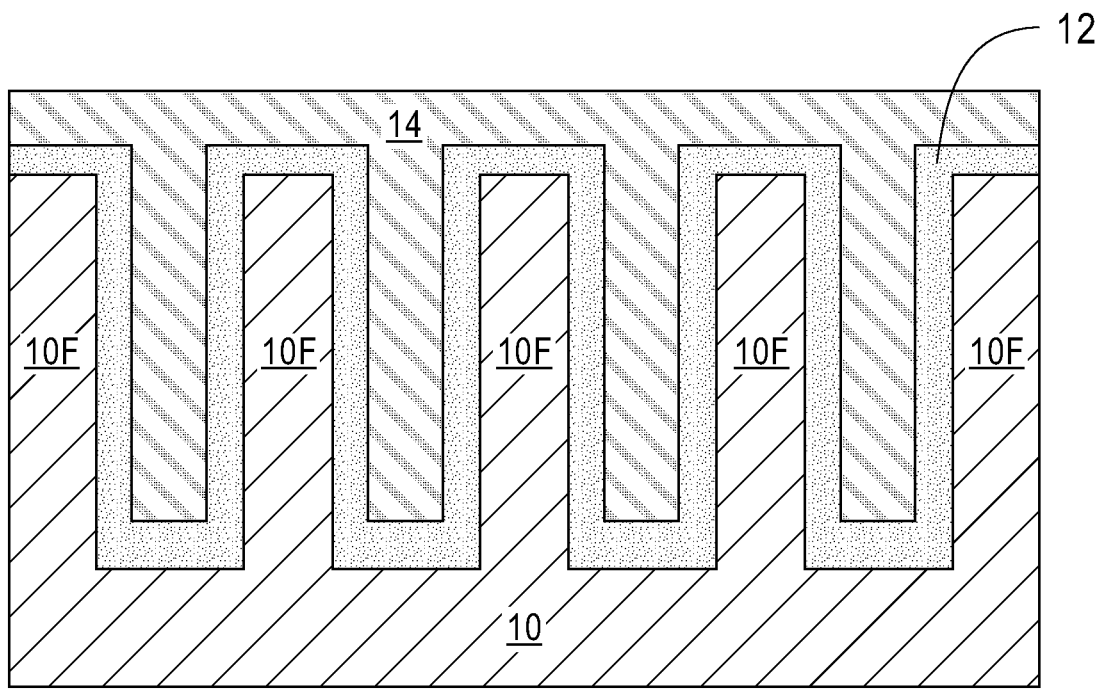
FIG. 3 is a cross sectional view of the exemplary semiconductor structure of FIG. 2 after forming a first dielectric material.

Referring now to FIG. 3, there is illustrated the exemplary semiconductor structure of FIG. 2 after forming a first dielectric material 14. The first dielectric material 14 is formed over the conformal layer 12 and fills a remaining portion of each gap that is present between the first semiconductor fins 10F.

The first dielectric material 14 includes any dielectric material. The dielectric material that can be used as the first dielectric material 14 may be entirely undoped, entirely doped, or contain, from bottom to top, a doped region and an undoped region. In one embodiment of the present application, the first dielectric material 14 is composed of undoped silicon dioxide. Examples of doped dielectric materials that can be used as at least a portion of the first dielectric material 14 include a doped oxide such as, for example, boron doped silicate glass (BSG) or arsenic doped silicate glass (ASG). The first dielectric material 14 may be formed utilizing a deposition process such as, for example, chemical vapor deposition or plasma enhanced chemical vapor deposition.

Figure 4:
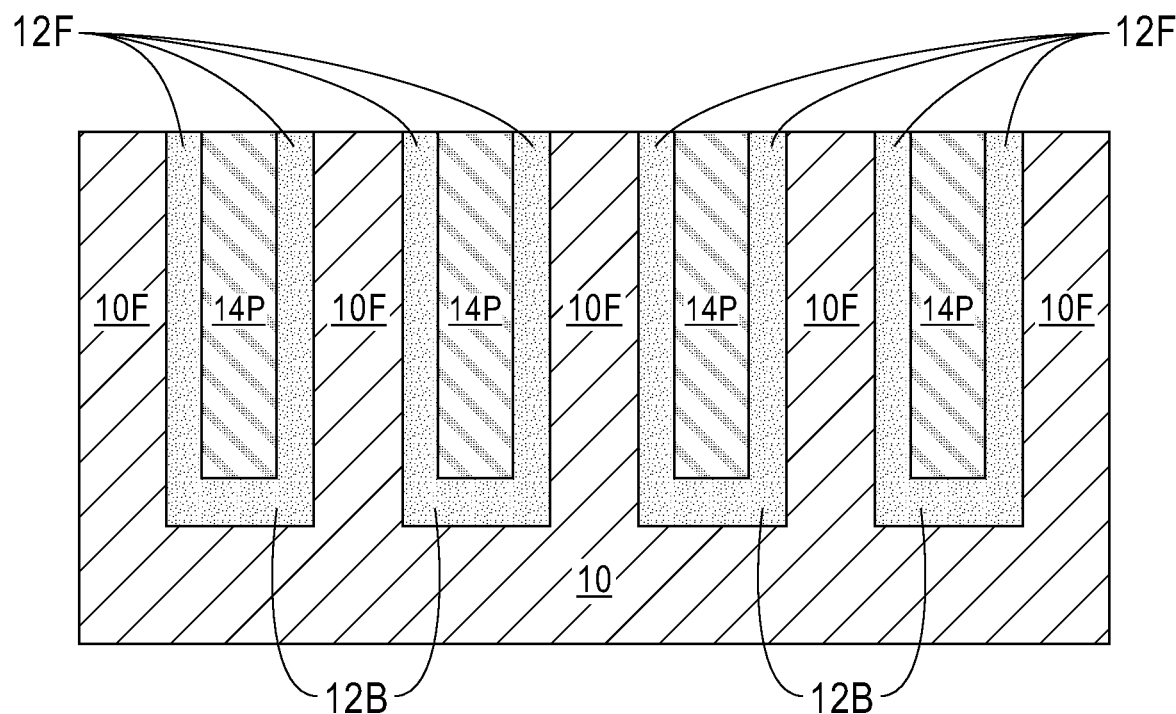
FIG. 4 is a cross sectional view of the exemplary semiconductor structure of FIG. 3 after performing a planarizing process, wherein the planarizing process removes an upper portion of the first dielectric material and a portion of the conformal layer of the second semiconductor material that is present on the topmost surface of each first semiconductor fin to provide a first dielectric material portion and a plurality of second semiconductor fins of the second semiconductor material.

Referring now to FIG. 4, there is illustrated the exemplary semiconductor structure of FIG. 3 after performing a planarizing process. The planarizing process that can be used in the present application may include chemical mechanical polishing, grinding or a combination thereof.

As is shown, the planarizing process removes an upper portion of the first dielectric material 14 and a portion of the conformal layer 12 of the second semiconductor material that is present on the topmost surface of each first semiconductor fin 10F to provide a first dielectric material portion 14P and a plurality of second semiconductor fins 12F of the second semiconductor material. After planarizing, each first dielectric material portion 14P, each second semiconductor fin 12F and each first semiconductor fin 10F have topmost surfaces that are coplanar with each other.

As is further shown, the plurality of second semiconductor fins 12F include a pair of spaced apart second semiconductor fins 12F located on a fin pedestal structure 12B; the fin pedestal structure 12B and the second semiconductor fins 12F both comprise remaining portions of the conform layer 12. Each pair of spaced apart second semiconductor fins 12F includes one second semiconductor fin extending upwards from a first end of one of the fin pedestal structures and another of the second semiconductor fins of the pair of spaced apart semiconductor extending upwards from a second end of the same the fin pedestal structure. Collectively, the fin pedestal structure 12B and its' respective pair of second semiconductor fins 12F form a continuous U-shaped second semiconductor fin-containing structure between nearest neighboring pairs of first semiconductor fins 10F.

Figure 5:
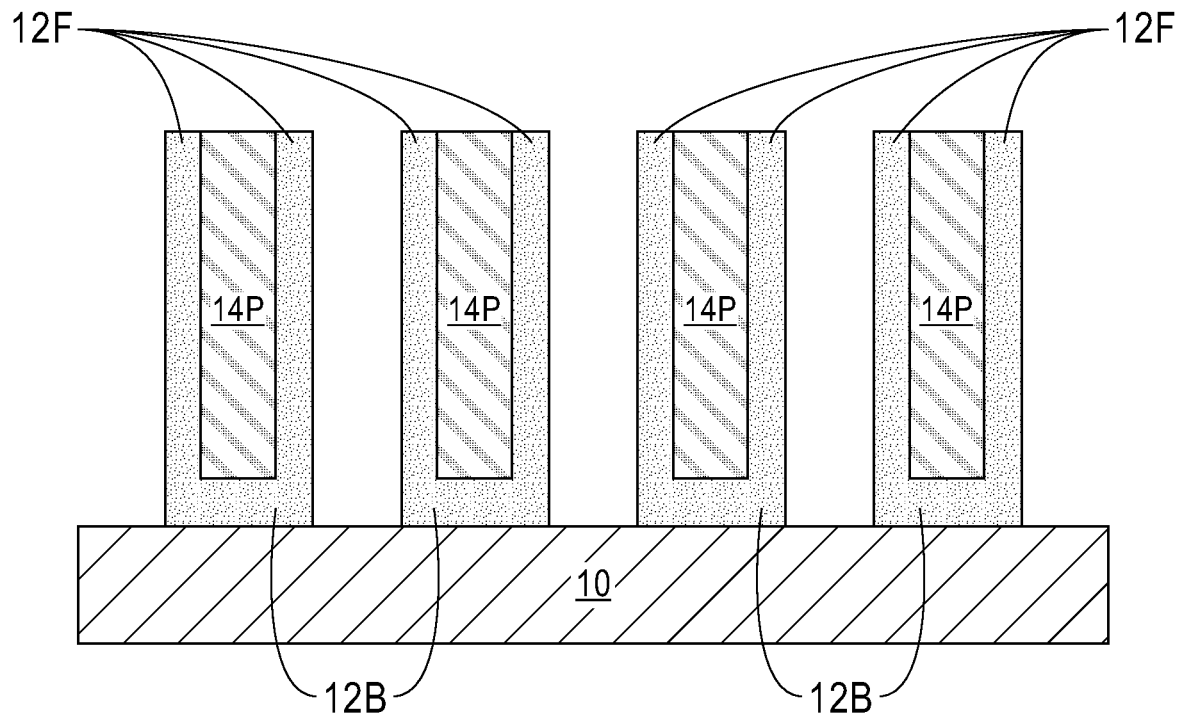
FIG. 5 is a cross sectional view of the exemplary semiconductor structure of FIG. 4 after removing each first semiconductor fin.

Referring now to FIG. 5, there is illustrated the exemplary semiconductor structure of FIG. 4 after removing each first semiconductor fin 10F; the continuous U-shaped second semiconductor fin-containing structures (12B, 12F) and the first dielectric material portion 14P remain on the bulk semiconductor substrate 10. Each first semiconductor fin 10F may be removed utilizing an etching process that is selective in removing the first semiconductor material relative to the second semiconductor material. In one embodiment, and when the first semiconductor material is composed of silicon, and the second semiconductor material is composed of a silicon germanium alloy, potassium hydroxide or tetramethylammonium hydroxide may be used as an etchant for selectively removing the first semiconductor fins 10F relative to the second semiconductor fins 12F.

Figure 6:
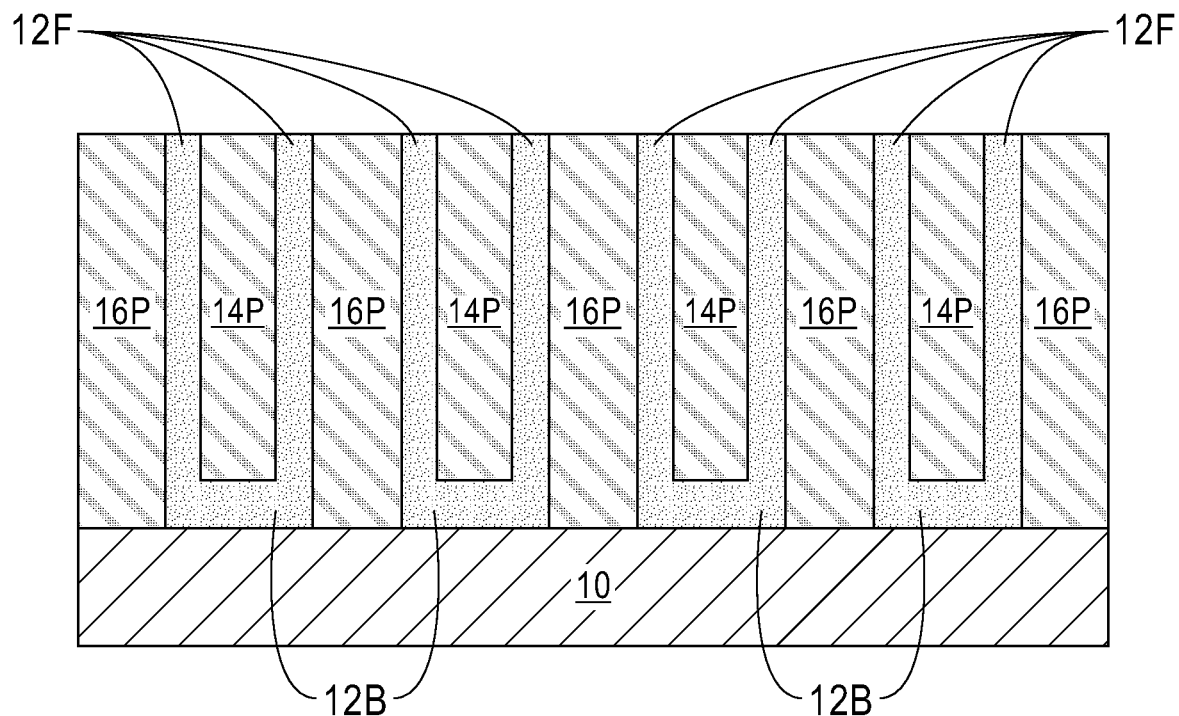
FIG. 6 is a cross sectional view of the exemplary semiconductor structure of FIG. 5 after forming a second dielectric material portion, wherein the second dielectric material portion has a topmost surface that is coplanar with a topmost surface of the first dielectric material portion and each second semiconductor fin.

Referring now to FIG. 6, there is illustrated the exemplary semiconductor structure of FIG. 5 after forming a second dielectric material portion 16P, wherein the second dielectric material portion 16P has a topmost surface that is coplanar with a topmost surface of the first dielectric material portion 14P and each second semiconductor fin 12F.

The second dielectric material portion 16P can be formed by forming a second dielectric material (not shown) within the area previous occupied by the first semiconductor fins 10F and atop the continuous U-shaped second semiconductor fin-containing structures (12B, 12F) and the first dielectric material portion 14P shown in FIG. 5. A planarization process such as, chemical mechanical planarization, can then be used to provide the exemplary semiconductor structure shown in FIG. 6.

The second dielectric material that provides the second dielectric material portion 16P may include any of the dielectric materials mentioned above for the first dielectric material 14. In some embodiments of the present application, the second dielectric material that provides the second dielectric material portion 16P comprises a same dielectric material as the first dielectric material 14. In other embodiments, the second dielectric material that provides the second dielectric material portion 16P comprises a different dielectric material than the first dielectric material 14. The second dielectric material may be doped, undoped or contain, from bottom to top, a doped region and an undoped region.

Figure 7:
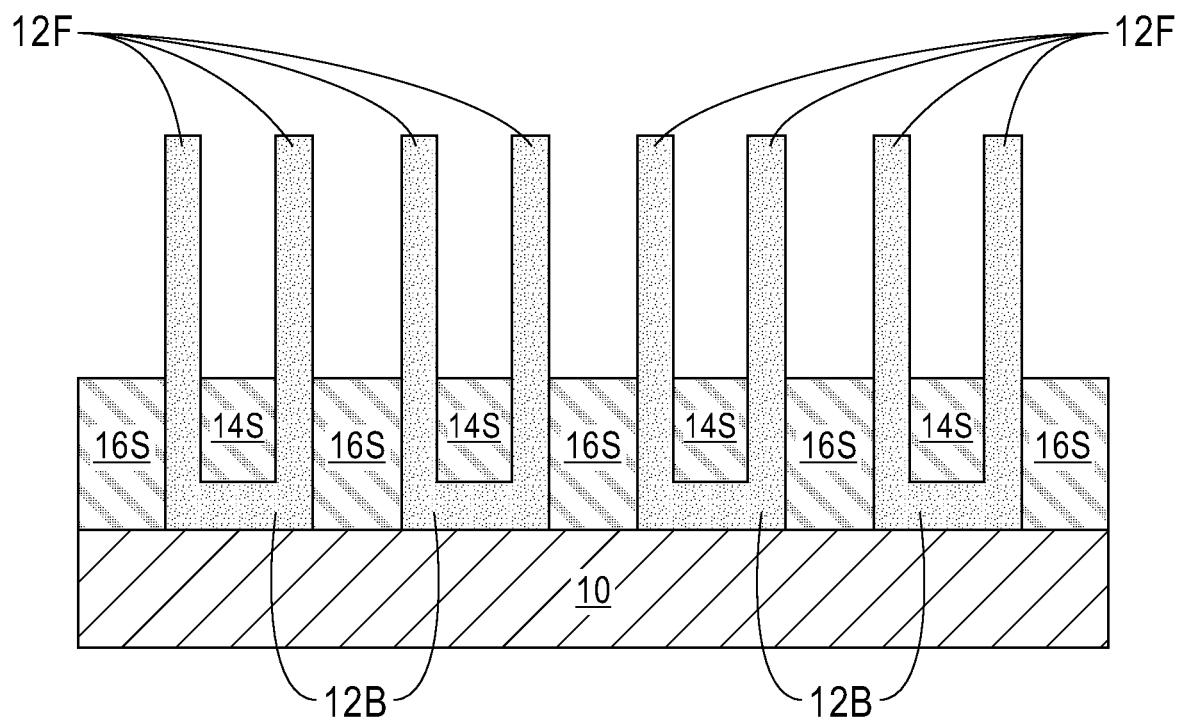
FIG. 7 is a cross sectional view of the exemplary semiconductor structure of FIG. 6 after recessing the first and second dielectric material portions to expose an upper portion of each second semiconductor fin.

Referring now to FIG. 7, there is illustrated the exemplary semiconductor structure of FIG. 6 after recessing the first and second dielectric material portions (14P, 16P) to expose an upper portion (including upper sidewalls and a topmost surface) of each second semiconductor fin 12F; lower portions of each second semiconductor fin 12F and each fin pedestal structure 12B are not exposed. Each remaining portion of the first dielectric material portion 14P may be referred to herein as a first dielectric material structure 14S, and each remaining portion of the second dielectric material portion 16P may be referred to herein as a second dielectric material structure 16S. As is shown, topmost surfaces of the first and second dielectric material structures (14S, 16S) are coplanar with each other, and the topmost surfaces of the first and second dielectric material structure (14S, 16S) are located beneath a topmost surface of each second semiconductor fin 12F such that upper sidewall portions and the topmost surface of each second semiconductor fin 12F are exposed.

As is shown, each second dielectric material structure 16S is located on a surface of the underlying bulk semiconductor substrate 10, while each first dielectric material structure 14S is located on a surface of one of the fin pedestal structures 12B and between a pair of second semiconductor fins 12F that are present on the fin pedestal structure 12B.

The recessing of the first and second dielectric material portions (14P, 16P) may be performed utilizing one or more etching processes that is(are) selective in removing dielectric material relative to the second semiconductor material that provides each second semiconductor fin 12F. In embodiments when the first dielectric material and second dielectric material are both composed of silicon dioxide, hydrofluoric acid or a buffered oxide etch (i.e., ammonium fluoride and hydrofluoric acid) may be used.

Figure 8:
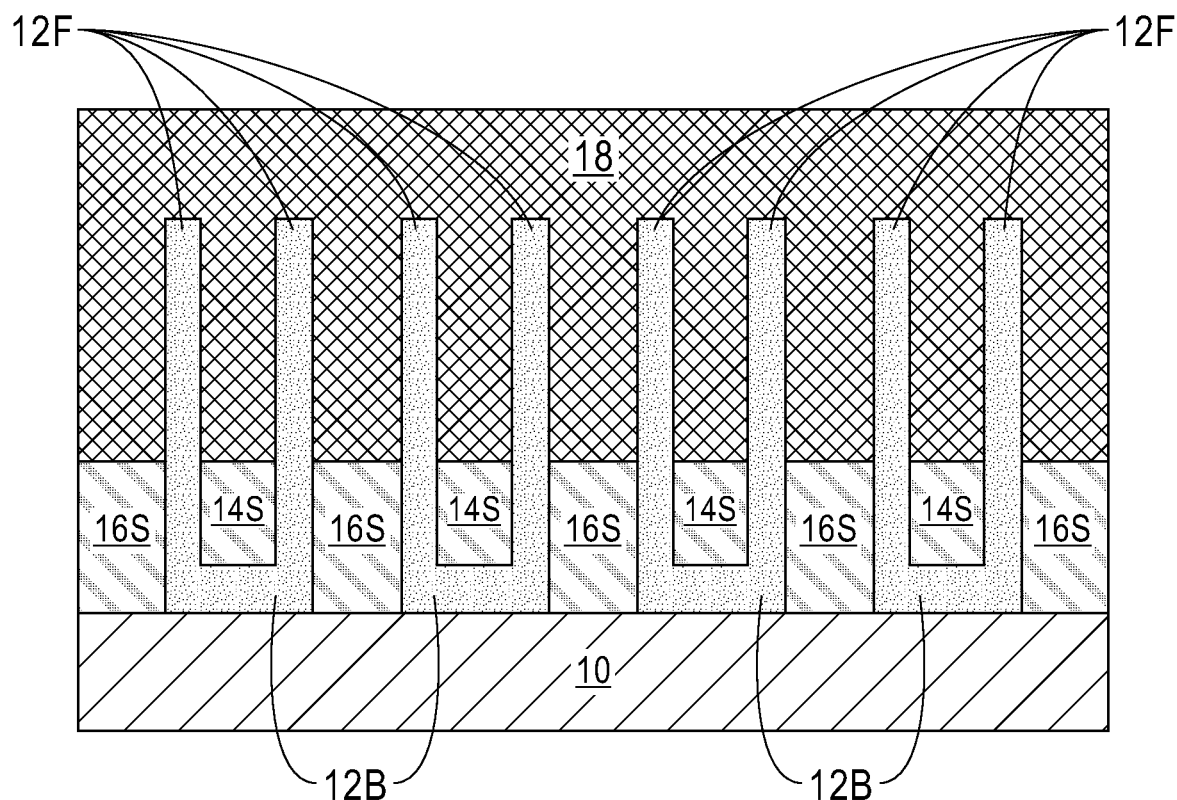
FIG. 8 is a cross sectional view of the exemplary semiconductor structure of FIG. 7 after forming a functional gate structure straddling each second semiconductor fin.

Referring now to FIG. 8, there is illustrated the exemplary semiconductor structure of FIG. 7 after forming a functional gate structure 18 straddling each second semiconductor fin 12F. Although the present application describes and illustrates the formation of a single functional gate structure 18, a plurality of functional gate structures can be formed straddling different portions of each second semiconductor fin 12F The term "straddling" denotes that the functional gate structure is formed across (i.e., over) a semiconductor material fin such that a first portion of each functional gate structure is present on one side of the semiconductor material fin and a second portion of each functional gate structure is present on another side of the semiconductor material fin. Also, a portion of the functional gate structure is also located on a topmost surface of a portion of semiconductor material fin. By "functional gate structure" it is meant a permanent gate structure used to control output current (i.e., flow of carriers in the channel) of a semiconducting device through electrical or magnetic fields. Each functional gate structure that is formed includes a gate material stack (not shown) of, from bottom to top, a gate dielectric portion and a gate conductor portion. In some embodiments, a gate cap portion (also not shown) can be present atop the gate conductor portion.

Each gate dielectric portion comprises a gate dielectric material. The gate dielectric material that provides the gate dielectric portion can be an oxide, nitride, and/or oxynitride. In one example, the gate dielectric material that provides the gate dielectric portion can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric can be formed and used as the gate dielectric portion.

The gate dielectric material used in providing the gate dielectric portion can be formed by any deposition process including, for example, chemical vapor deposition (CVD), plasma enhanced chemical vapor deposition (PECVD), physical vapor deposition (PVD), sputtering, or atomic layer deposition. In some embodiments and when multiple functional gate structures are formed, each gate dielectric portion comprises a same gate dielectric material. In other embodiments and when multiple functional gate structures are formed, some of the gate dielectric portions may comprise a first gate dielectric material, while other gate dielectric portions may comprise a second gate dielectric material that differs in composition from the first gate dielectric material. When a different gate dielectric material is used for the gate dielectric portions, block mask technology can be used. In one embodiment of the present application, the gate dielectric material used in providing the gate dielectric portion can have a thickness in a range from 1 nm to 10 nm. Other thicknesses that are lesser than, or greater than, the aforementioned thickness range can also be employed for the gate dielectric material.

Each gate conductor portion comprises a gate conductor material. The gate conductor material used in providing the gate conductor portion can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof. In some embodiments, the gate conductor portion may comprise an nFET gate metal. In other embodiments, the gate conductor portion may comprise a pFET gate metal. In yet other embodiments and when multiple functional gate structures are formed, some of the gate conductor portions comprise an nFET gate metal, while others gate conductor portions comprise a pFET gate metal.

The gate conductor material used in providing the gate conductor portion can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. When a different gate conductor material is used for the gate conductor portions, block mask technology can be used. In one embodiment, the gate conductor material used in providing the gate conductor portion has a thickness from 1 nm to 100 nm. Other thicknesses that are lesser than, or greater than, the aforementioned thickness range can also be employed for the gate conductor material used in providing the gate conductor portion.

If present, the gate cap portion comprises a gate cap material. The gate cap material that provides each gate cap portion may include one of the dielectric materials mentioned above for hard mask material. In one embodiment, each gate cap portion comprises silicon dioxide, silicon nitride, and/or silicon oxynitride. The dielectric material that provides each gate cap portion can be formed utilizing a conventional deposition process such as, for example, chemical vapor deposition or plasma enhanced chemical vapor deposition. The dielectric material that provides each gate cap portion can have a thickness from 5 nm to 20 nm. Other thicknesses that are lesser than, or greater than, the aforementioned thickness range can also be employed as the thickness of the dielectric material that provides each gate cap portion.

Each functional gate structure can be formed by providing a functional gate material stack of, from bottom to top, the gate dielectric material, the gate conductor material and, if present, the gate cap material. The functional gate material stack can then be patterned. In one embodiment of the present application, patterning of the functional gate material stack may be performed utilizing lithography and etching.

In other embodiments of the present application, at least one sacrificial gate structure is formed first and then replaced with a functional gate structure. By sacrificial gate structure" it is meant a material or material stack that serves as a placeholder for a subsequently formed functional gate structure. In such a process, the functional gate structure is formed after the source/drain structures have been formed. In such an embodiment, the gate dielectric portion of the functional gate structure may be U-shaped. By "U-shaped" it is meant a material that includes a bottom horizontal surface and a sidewall surface that extends upward from the bottom horizontal surface. When employed, the sacrificial gate structure may include a sacrificial gate dielectric portion, a sacrificial gate material portion and a sacrificial gate cap portion. In some embodiments, the sacrificial gate dielectric portion and/or sacrificial gate cap portion may be omitted. The sacrificial gate dielectric portion includes one of the dielectric materials mentioned above for the gate dielectric portion. The sacrificial gate material portion includes one of the gate conductor materials mentioned above for gate conductor portion. The sacrificial gate cap portion includes one of the gate cap material mentioned above for gate cap portions. The sacrificial gate structures can be formed by deposition of the various material layers and then patterning the resultant sacrificial material sack by utilizing, for example, lithography and etching.

After forming the gate structure (functional or sacrificial gate structure) source/drain regions (not) can be formed utilizing an epitaxial growth process from exposed portions of each semiconductor material fin that are not protected by a gate structure; the source/drain regions would by located within a plane that runs into and out of the drawings of the present application. The source/drain regions comprise any semiconductor material including, for example, silicon, silicon germanium alloys or III-V compound semiconductors. The semiconductor material that provides the source/drain regions is doped with an n-type dopant or a p-type dopant as are well known those skilled in the art. The doping may be achieved during the epitaxial growth of the semiconductor material that provides the source/drain regions or after epitaxial growth of an intrinsic semiconductor material by utilizing ion implantation or gas phase doping.

In some embodiments, and prior to formation of the source/drain regions, a gate spacer (also not shown) can be formed on exposed sidewalls of the gate structure. The gate spacer can be formed by deposition of a gate spacer material, such as, for example, a dielectric oxide, and then etching the deposited gate spacer material by utilizing a spacer etch.

Figure 9:
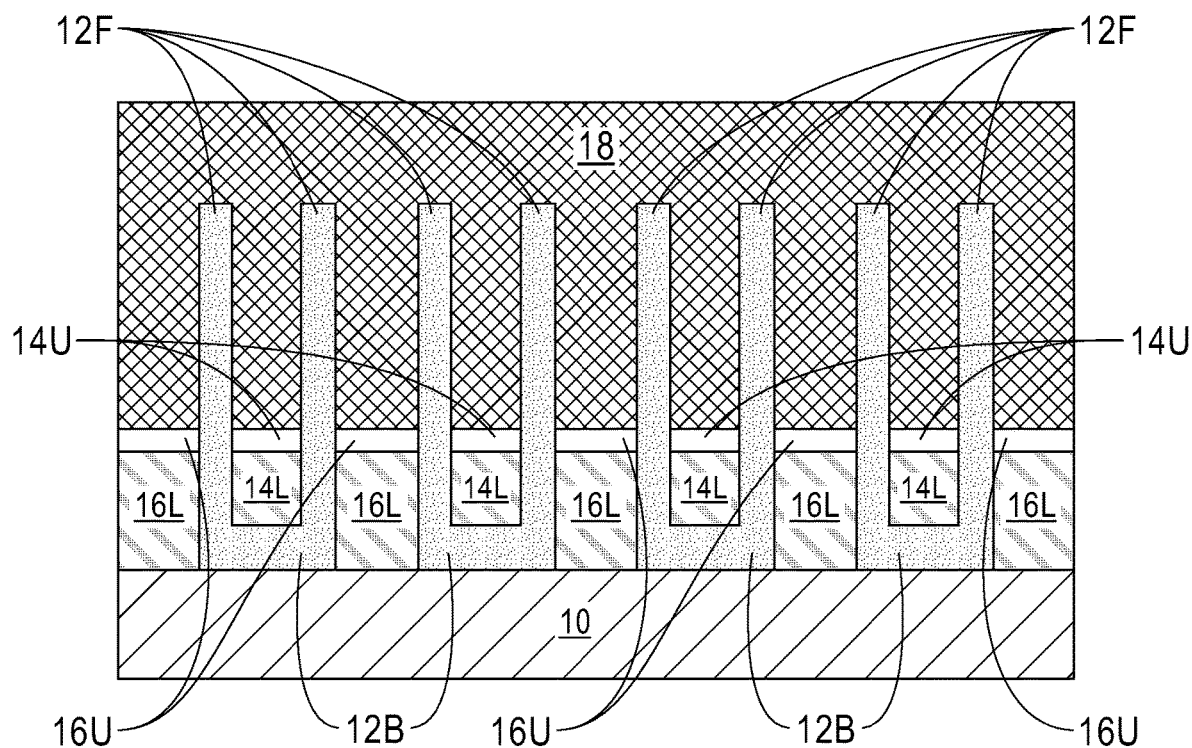
FIG. 9 is a cross sectional view of another exemplary semiconductor structure of the present application that can be derived from the processing steps shown in FIGS. 1-8 of the present application.

Referring now to FIG. 9, there is illustrated another exemplary semiconductor structure of the present application that can be derived from the processing steps shown in FIGS. 1-8 of the present application. In this embodiment of the present application, the first and second dielectric materials are composed of a dielectric material that includes a doped region and an undoped region. In some embodiments, the undoped region is omitted and the entirety of the first and second semiconductor materials is composed of a doped dielectric material. In the drawing, element 16U represents an upper undoped region (e.g., silicon dioxide) of a second dielectric material structure, while element 16L represents a lower doped region (e.g., boron doped silicate glass (BSG) or arsenic doped silicate glass (ASG) of the second dielectric material structure. Also, and in the drawing, element 14U represents an upper undoped region (e.g., silicon dioxide) of a first dielectric material structure, while element 16L represents a lower doped region (e.g., boron doped silicate glass (BSG) or arsenic doped silicate glass (ASG) of the first dielectric material structure.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
a bulk semiconductor substrate of a first semiconductor material;
a plurality of spaced apart fin pedestal structures of a second semiconductor material located on the bulk semiconductor substrate, wherein the second semiconductor material is different from the first semiconductor material;
a pair of spaced apart semiconductor fins of the second semiconductor material located on each fin pedestal structure, wherein one of the semiconductor fins of the pair of spaced apart semiconductor fins has a sidewall surface that is vertically aligned with a sidewall surface of a first end of each of the fin pedestal structures and another of the semiconductor fins of the pair of spaced apart semiconductor has a sidewall surface that is vertically aligned with a sidewall surface of a second end of each of the fin pedestal structures;
a first dielectric material structure located between each semiconductor fin of the pair of semiconductor fins and present on a topmost surface of each of the fin pedestal structures; and
a second dielectric material structure located between each fin pedestal structure and having a bottommost surface directly on a topmost surface of the bulk semiconductor substrate, wherein the first dielectric material structure is composed entirely of a first doped dielectric material, the second dielectric material structure is composed entirely of a second doped dielectric material, and the bottommost surface of the second dielectric material structure is coplanar with a bottommost surface of each of the fin pedestal structure and the pair of semiconductor fins.

2. The semiconductor structure of claim 1, wherein the first and second dielectric material structures have a topmost surface that are coplanar with each other.

3. The semiconductor structure of claim 1, wherein the second semiconductor material is substantially defect-free.

4. The semiconductor structure of claim 3, wherein the second semiconductor material is relaxed.

5. The semiconductor structure of claim 1, wherein the first dielectric material structure has a topmost surface that is located beneath a topmost surface of each semiconductor fin of the pair of semiconductor fins.

6. The semiconductor structure of claim 5, wherein the second dielectric material structure has a topmost surface that is located beneath the topmost surface of each semiconductor fin of the pair of semiconductor fins, and wherein the topmost surface of the second dielectric material structure is coplanar with the topmost surface of the first dielectric material structure.

7. The semiconductor structure of claim 1, wherein the first and second dielectric material structures are composed of a same doped dielectric material.

8. The semiconductor structure of claim 7, wherein the first and second doped dielectric material structures are composed of boron doped silicate glass or arsenic doped silicate glass.

9. The semiconductor structure of claim 1, wherein each fin pedestal structure and its corresponding pair of spaced apart semiconductor fins are of unitary construction and provide a continuous U-shaped semiconductor fin structure.

10. The semiconductor structure of claim 1, wherein the second semiconductor material has a higher carrier mobility than the first semiconductor material.

11. The semiconductor structure of claim 1, further comprising a functional gate structure straddling each semiconductor fin.

12. The semiconductor structure of claim 11, wherein the second semiconductor material is composed of a silicon germanium alloy or a III-V compound semiconductor, and the first semiconductor material is composed of silicon.

13. The semiconductor structure of claim 11, wherein the functional gate structure has a first bottommost portion that contacts a topmost surface of the second dielectric material structure, and a second bottommost portion that contacts a topmost surface of the first dielectric material structure.

14. The semiconductor structure of claim 1, wherein the first dielectric material structure has a bottommost surface that is vertically offset and located above a bottommost surface of the second dielectric material structure.

15. The semiconductor structure of claim 14, wherein the first dielectric material structure has a topmost surface that is coplanar with a topmost surface of the second dielectric material structure.

* * * * *